(12) United States Patent
Goossen (10) Patent No.: US 6,707,840 B2
(45) Date of Patent: Mar. 16, 2004

(54) VERTICAL CAVITY SURFACE EMITTING LASER

(76) Inventor: Keith W. Goossen, 137 Essy St., Howell, NJ (US) 07731

( * ) Notice: Subject to any disclaimer, the term of this patent is extended or adjusted under 35 U.S.C. 154(b) by 0 days.

(21) Appl. No.: 09/873,640

(22) Filed: Jun. 4, 2001

(65) Prior Publication Data

US 2002/0181530 A1 Dec. 5, 2002

(51) Int. Cl.$^7$ .............................................. H01S 5/183
(52) U.S. Cl. ......................................... 372/96; 372/46
(58) Field of Search ............................... 372/50, 46, 96

(56) References Cited

U.S. PATENT DOCUMENTS 6,144,682 A * 11/2000 Sun ............................. 372/96

* cited by examiner

Primary Examiner—James Davie

(57) ABSTRACT

A Vertical Cavity Surface Emitting Laser, VSEL. Prior-art VCSELs contain an optical cavity between two mirrors. Near one mirror are positioned current blockers which surround part of the cavity and prevent current from reaching regions of the cavity which are near edges of that mirror. If current reached those regions, lasing would occur there, and the light produced would be scattered by the nearby edges of the mirror. The current blockers reduce that scattering. However, the fabrication steps following those which create the current blockers are expensive. The invention eliminates the expensive steps by (1) placing a layer of gold atop the current blockers and the surrounded lasing region, (2) placing a dielectric layer of high index H atop the gold layer, and (3) placing a quarter-wave stack atop the high index dielectric layer, in the sequence L-H-L- . . . -H-L-H, wherein H represents a high index and L represents a low index. The gold delivers current to the cavity. Significantly, the stack (1) begins with an L adjacent the dielectric adjacent the gold and terminates with an H layer.

9 Claims, 14 Drawing Sheets

VERTICAL CAVITY SURFACE EMITTING LASER

The invention concerns an approach to fabricating current blocking regions in a Vertical Cavity Surface Emitting Laser, VCSEL. The approach is simpler and less expensive than those used presently.

BACKGROUND OF THE INVENTION

Figures 1, 2:
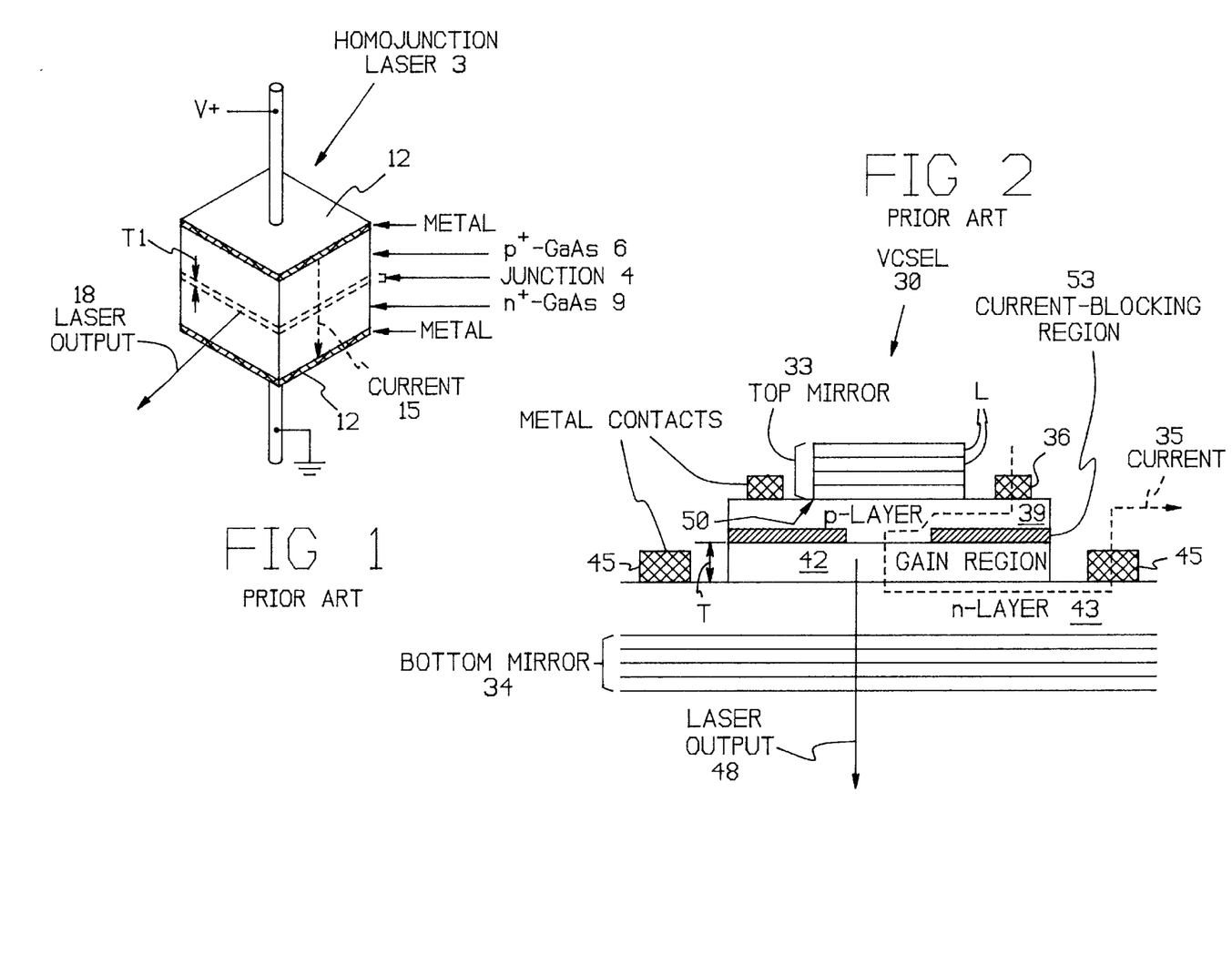
FIG. 1 is a simplified schematic of a prior-art homojunction laser.
FIG. 2 is a simplified schematic of a prior-art Vertical Cavity Surface Emitting Laser, VCSEL.

FIG. 1 is a simplified schematic of a homojunction laser 3, and is not drawn to scale. A PN junction 4 is formed between a p-plus-type body 6 of gallium arsenide, GaAs, and an n-plus-type body 9 of gallium arsenide. Metal contacts 12 provide entry- and exit paths for current 15, which is supplied by a voltage source V+. The laser produces laser output 18, which travels in a plane parallel to the junction 4. The laser will generally be situated in a resonant optical cavity, which is not shown.

FIG. 2 is a simplified schematic of a different type of laser, namely, the Vertical Cavity Surface Emitting Laser, VCSEL, labeled 30, and is also not drawn to scale. The VCSEL 30 includes a top mirror 33 and a bottom mirror 34. These mirrors are constructed of multiple layers L of dielectric material, each layer being ¼ wavelength thick.

Current 35, indicated by the dashed arrow, flows from a metal contact 36, through a p-type region 39, through a gain region 42, through an n-type region 43, and to another metal contact 45. The gain region 42 produces light, and multiple reflections of that light between the top mirror 33 and the bottom mirror 34 induce stimulated emission of laser light, which exits the device as indicated by ray 48.

A significant feature of the VCSEL 30 is that the laser light travels perpendicular to the plane of the gain region 42, that is, perpendicular to bottom mirror 34. Gain region 42 is analogous to junction 4 in FIG. 1, in the sense that population inversion occurs in both the gain region 42 and the junction 4.

In addition, in FIG. 2, the light which stimulates emission of photons within the gain region 42 bounces between the top mirror 33 and the bottom mirror 34. However, stimulated emission only occurs within the gain region 42. The thickness T of the gain region 42 is very small, of the order of a few hundred angstroms, and is much smaller than the corresponding distance Ti in Figure Thus, since stimulated emission in FIG. 2 only occurs along a relatively small thickness T, losses must be reduced to a minimum. One source of loss is scattering which would occur at the edge 50 of the top mirror 33. To reduce this loss, current-blocking regions 53 are fabricated. They block current from flowing near the edge 50. The absence of current means that photon generation is absent, so that stimulated emission is also absent, at that location.

Figure 3:
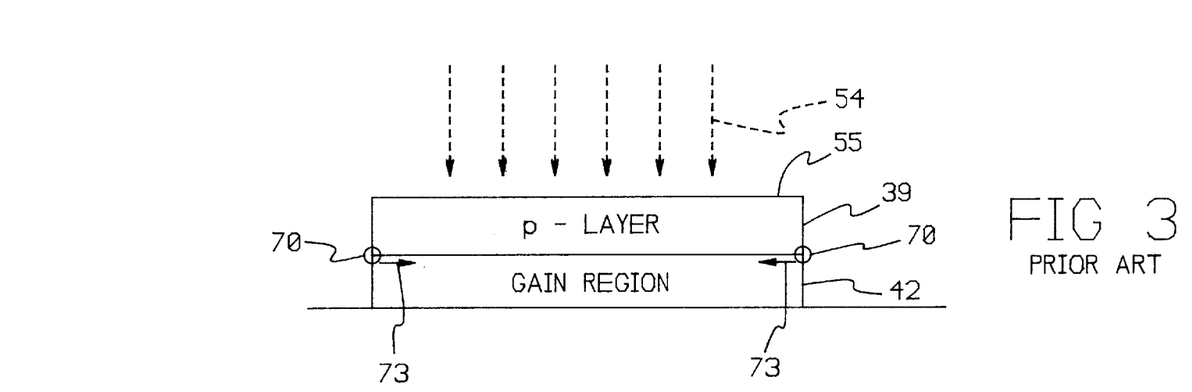
FIG. 3 illustrates ion implantation of layer 39 in FIG. 2.

Fabrication of the current-blocking region 53 is expensive, or at least complex. In one approach, ion implantation is used, wherein the p-type region 39 in FIG. 3 is bombarded by high-velocity ions, indicated by dashed arrows 54. These ions bury themselves beneath the surface 55 and generate the current-blocking region 53 in FIG. 4. Region 53 is generated because the ions 54 compensate the p-type dopants (not shown), effectively converting region 53 into an intrinsic semiconductor, which is low in conductivity, at least at room temperature.

Figure 4:
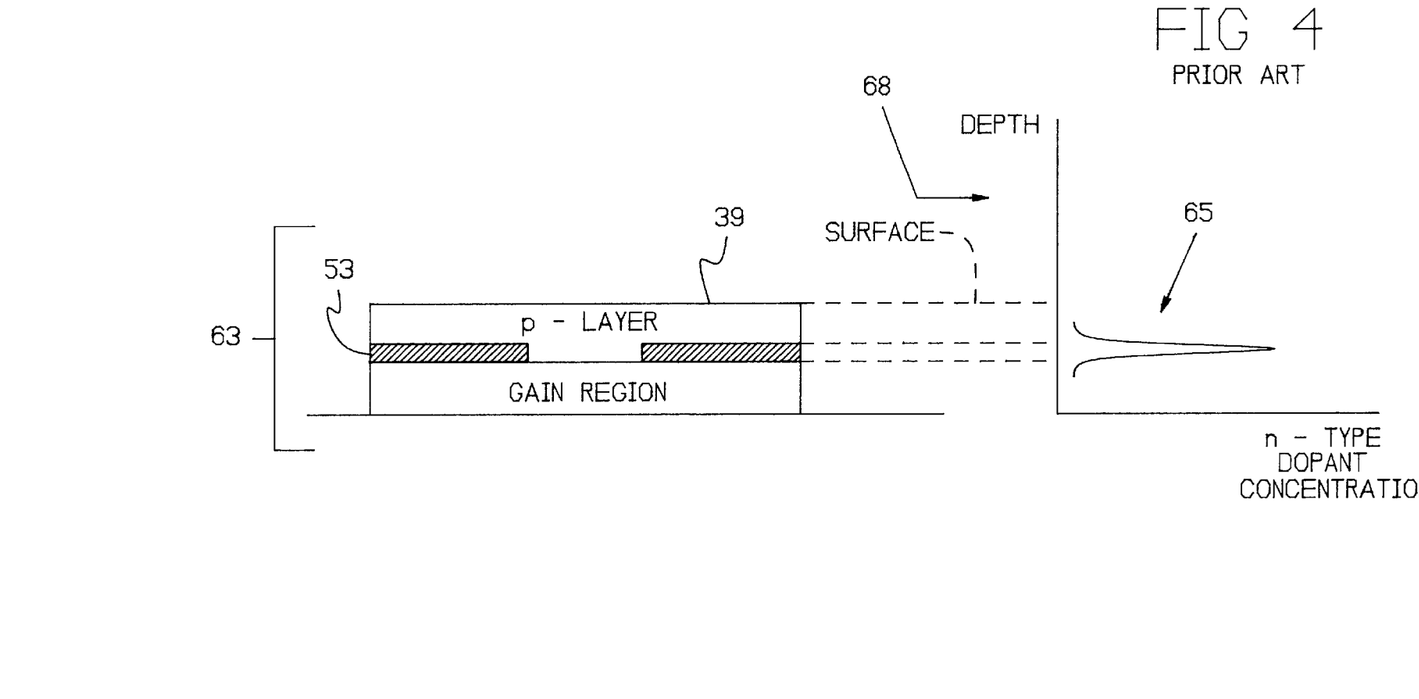
FIG. 4 illustrates the structure which results from the ion implantation of FIG. 3, and the spatial distribution of the ions.

However, this ion implantation technique requires strict process control in order to develop the proper profile 65 in plot 68 in FIG. 4. Plot 68 indicates ion concentration, as a function of depth in the p-type layer 39. Also, the overall process requires later annealing of the structure, after the implantation.

In another approach, current blocking region 53 is fabricated through lateral oxidation, wherein the oxidation is begun at regions 70 in FIG. 3, and invades the p-layer 39 as indicated by arrows 73. However, the lateral oxidation process is difficult to control.

Figure 5:
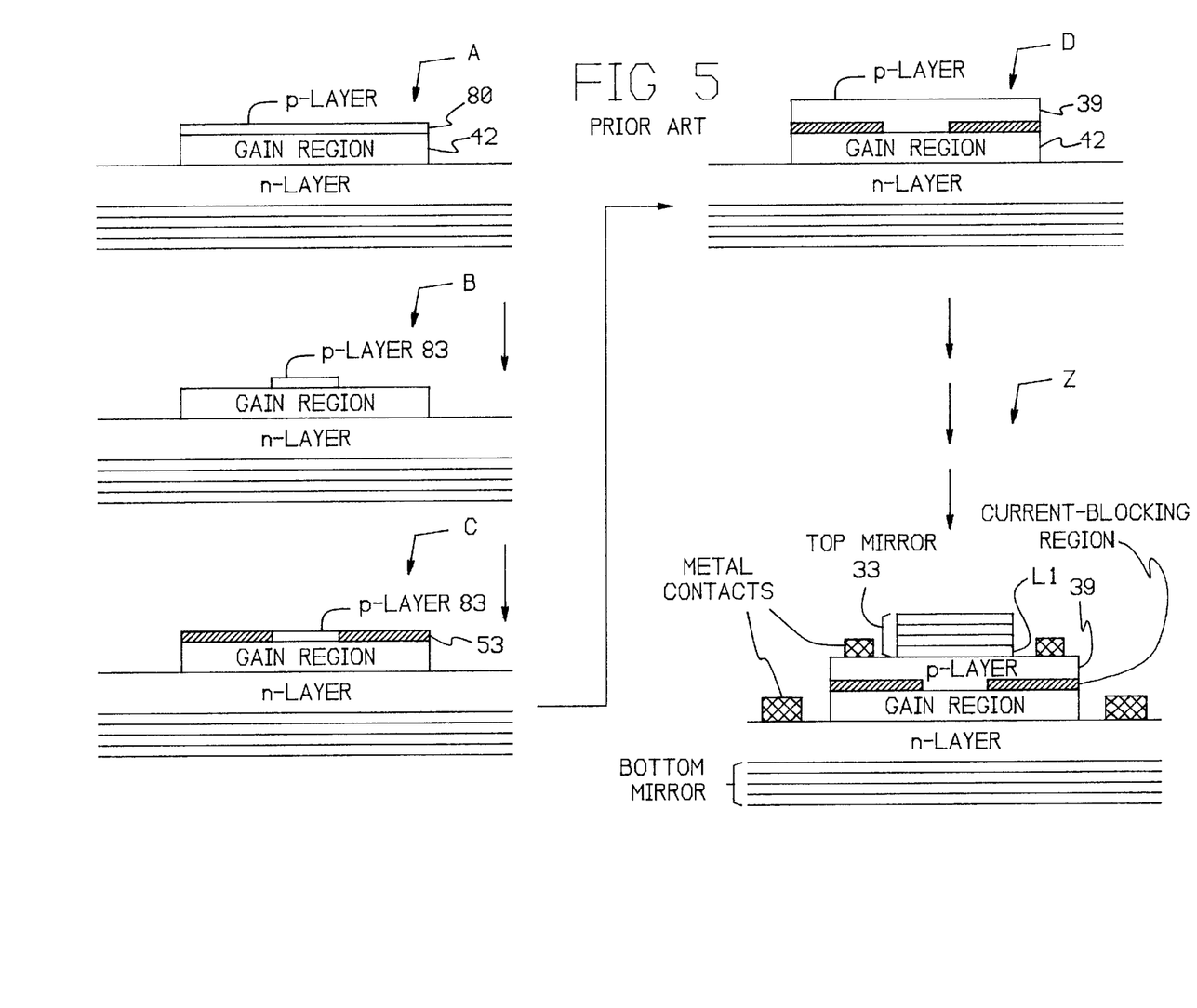
FIG. 5 illustrates a sequence of processing steps which can be used to produce the structure of FIG. 2.

In a third approach, shown in FIG. 5, a p-type layer 80 in structure A, at the upper left of the Figure, is etched away to form the mesa 83 in structure B. Then, in structure C, the current blocking layer 53 is fabricated, by implantation or surface oxidation. (Intermediate steps required for generation of layer 53 are not indicated.) Next, the p-type layer is expanded in size through crystal regrowth into body 39, as in Structure D. After that, known process steps are implemented to produce the final structure Z.

However, the processing steps required to convert structure C into structure D are expensive and complex. Specifically, the p-type layer 39 in structure D, as well as the gain region 42, must all consist of a monocrystalline body of material. Adding a monocrystalline body to the p-layer 83 shown in structure C, to create structure D, is a complex process, as is crystal regrowth generally, which is the process used.

The Inventors have developed a process for producing the current blocking region 53 in FIG. 2, but in a simpler manner than described above.

Numerous textbooks exist on laser technology. A good simplified treatment is found in *Optoelectronics. An Introduction,* by Wilson and Hawkes, Third Edition (Prentice Hall, 1998, ISBN 0-13-103961-X). This book is hereby incorporated by reference, partly to show, in simplified terms, the present state of the art.

SUMMARY OF THE INVENTION

In one form of the invention, a film of gold is positioned across the optical gain path of a VCSEL. The gold film delivers electrical current into the semiconductor material within the gain path, and eliminates the need for a crystal re-growth step.

DETAILED DESCRIPTION OF THE INVENTION

Figure 6:
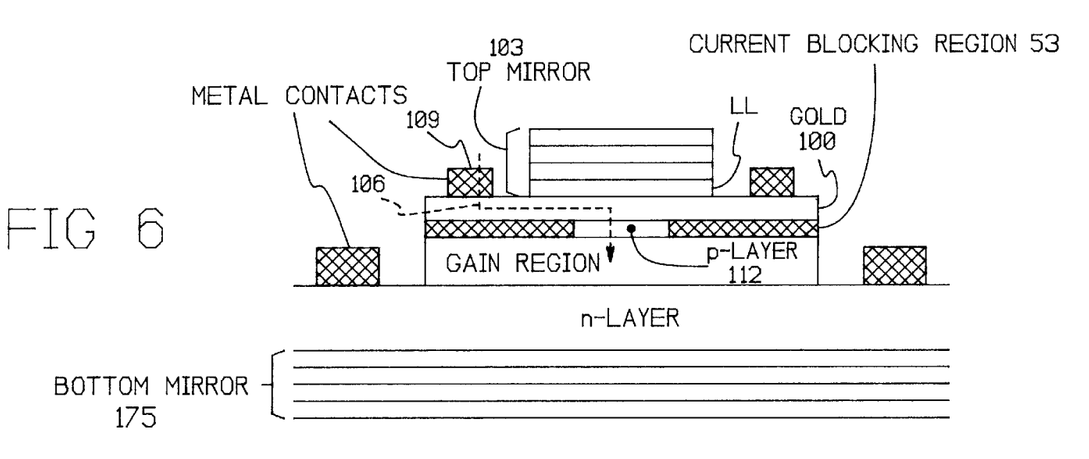
FIGS. 6 and 7 illustrate two forms of the invention.

FIG. 6 illustrates one form of the invention. A layer 100 of gold is shown, and is not drawn to scale. To attain the structure of FIG. 6, the layer of gold 100 can be deposited upon the intermediate structure C in FIG. 5, which is also shown as structure CC in FIG. 12, to produce structure DD in FIG. 12. Then, known processing steps can be undertaken to produce structure zz.

This represents an advancement over the prior art because the steps of (1) fabricating intermediate structure C in FIG. 6, (2) depositing gold layer 100, and then (3) producing the structure of FIG. 6 are simpler, less expensive, or both, than the prior-art processes of producing structure Z in FIG. 6, given the current state of technology.

In connection with FIG. 6, the Inventors have observed that, while gold is commonly thought to be absorptive of photons, it can nevertheless be used in a thin-layer form in FIG. 6 for a twofold purpose. One purpose is to act as part of, or cooperate with, a quarter-wave dielectric mirror stack, which is described later. A second purpose is to carry current 106 to the p-type layer 112. These features will be explained in greater detail. However, first, the Inventors will point out a particular feature of the prior art.

In multi-layer dielectric mirrors in the prior art generally, such as top mirror 33 in structure Z in FIG. 5, the layer L1 which is adjacent the p-layer 39 is given a low index of refraction (denoted "L" herein). The index is termed low because the mirror consists of a stack of alternating layers of high, and low, indices of refraction, as explained later in connection with FIGS. 8 and 9. The index of layer L1 is low, compared with the high-index layers in the top mirror 33.

Therefore, the prior-art feature of interest is that the index of refraction of the dielectric layer L1 which is closest to the gain region 42 in FIG. 5 is generally low. The term "nearest" will be used to refer to this type of dielectric layer L1, because it is the layer nearest the gain region.

In contrast, under the invention, the nearest dielectric layer LL in FIG. 6 is given a high index of refraction, H. Given this background fact, this discussion will return to explaining the invention.

The mirrors in FIGS. 5 and 6 are simplified. Specifically, the top mirror 33 in structure Z in FIG. 5, as well as the top mirror 103 in FIG. 6, are shown as having only a few layers. However, the actual numbers of layers stands near twenty, as FIGS. 8 and 9 indicate. This discussion will explain the reflection coefficients obtained for the mirrors of FIGS. 8 and 9.

Figure 8:
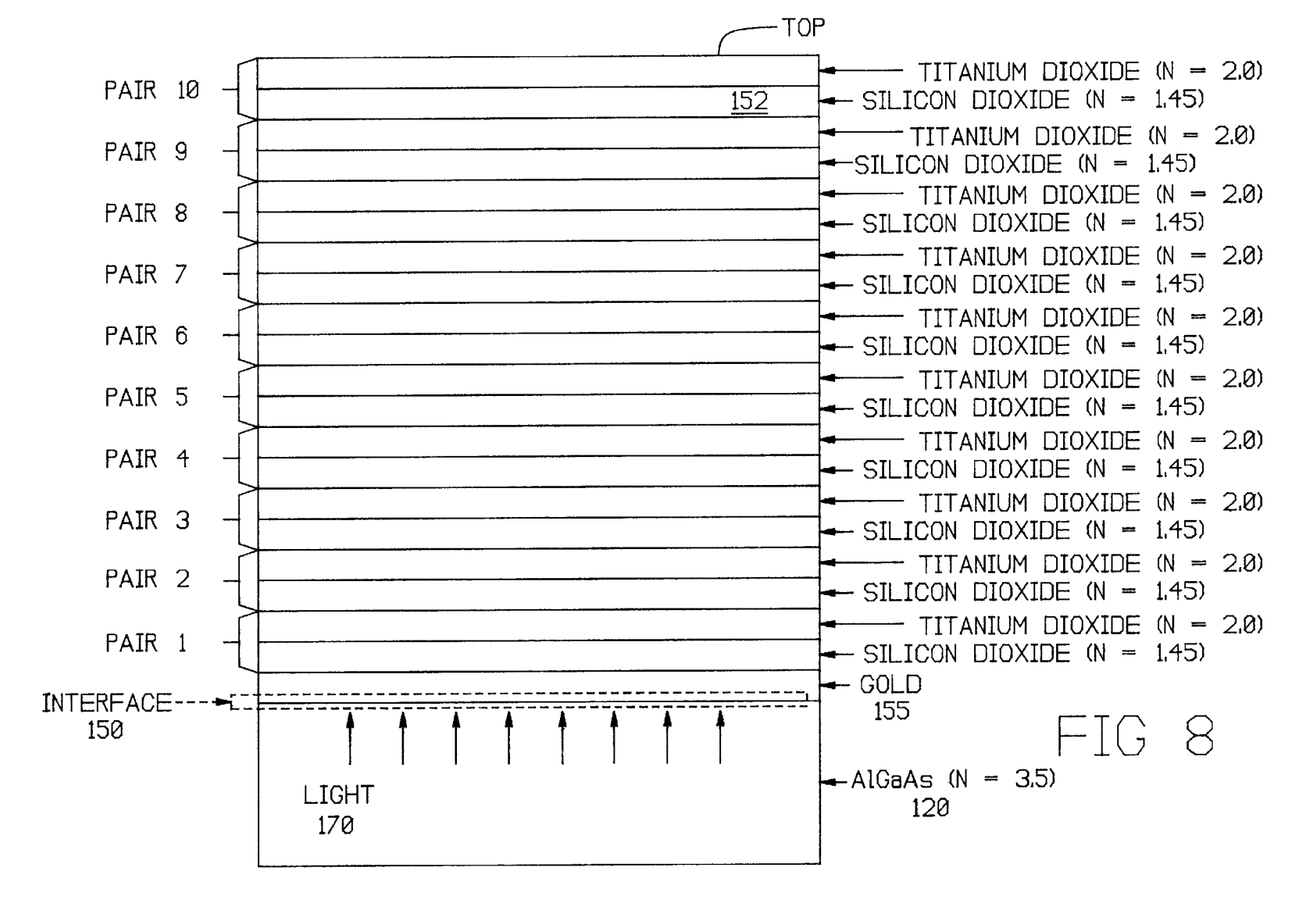
FIGS. 8 and 9 illustrate interfaces 150 at which a reflection coefficient is computed. The structures shown in FIGS. 8 and 9 are not admitted to be found in the prior art.
Figure 9:
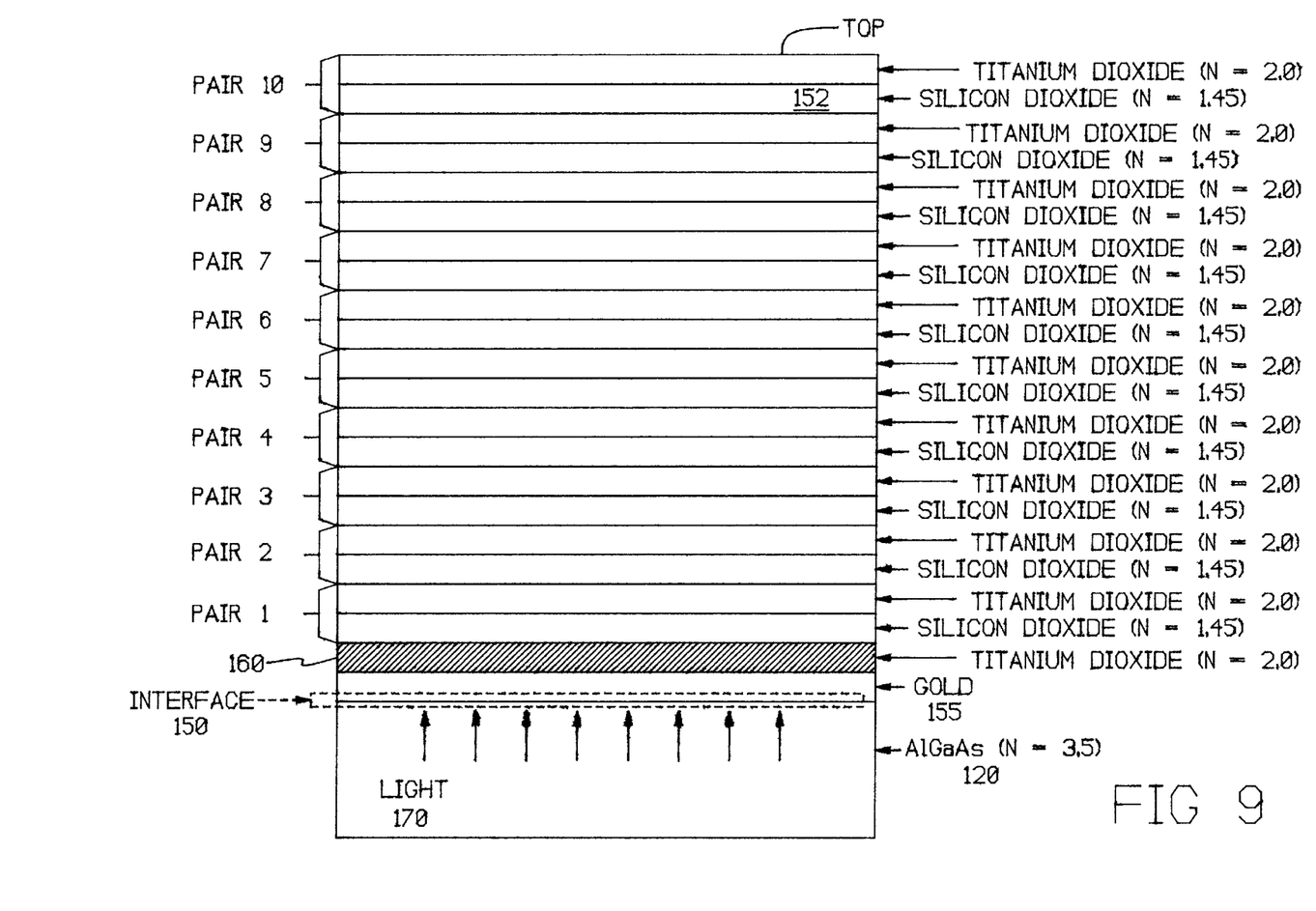

A primary difference between the mirrors of these two Figures is that FIG. 9 contains an extra layer 160, located near the bottom and shown hatched. This layer is not present in FIG. 8. Otherwise, both structures are similar, and share the following features.

One feature is that a semiconductor substrate 120 of aluminum gallium arsenide, AlGaAs, is used.

A second feature is that the topmost layer TOP of the 20-odd layers is of high, H, refractive index. Titanium dioxide was used, having a refractive index, N, of 2.0.

A third feature is that the topmost layer TOP is paired with a layer 152 beneath it, which is of low, L, index of refraction. Silicon dioxide was used, having a refractive index, N, of 1.45.

A fourth feature is that ten of these layer-pairs are present, labeled PAIR 1 through PAIR 10.

A fifth feature is that a layer 155 of gold may be present. In some of the computations described below, the layer 155 is given zero thickness, meaning that the layer 155 of gold is absent for that computation. However, the layer 155 is illustrated in order to illustrate its position, when present.

The computations of the reflection coefficient of the mirrors of FIGS. 8 and 9, about to be described, presumed that plane-wave light 170 strikes the interface 150. In effect, the interface 150 was presumed to be infinite in extent, and the light source (not shown) was presumed to be either (1) planar and infinite in extent or (2) a point source positioned infinitely far from the interface 150.

Figure 10:
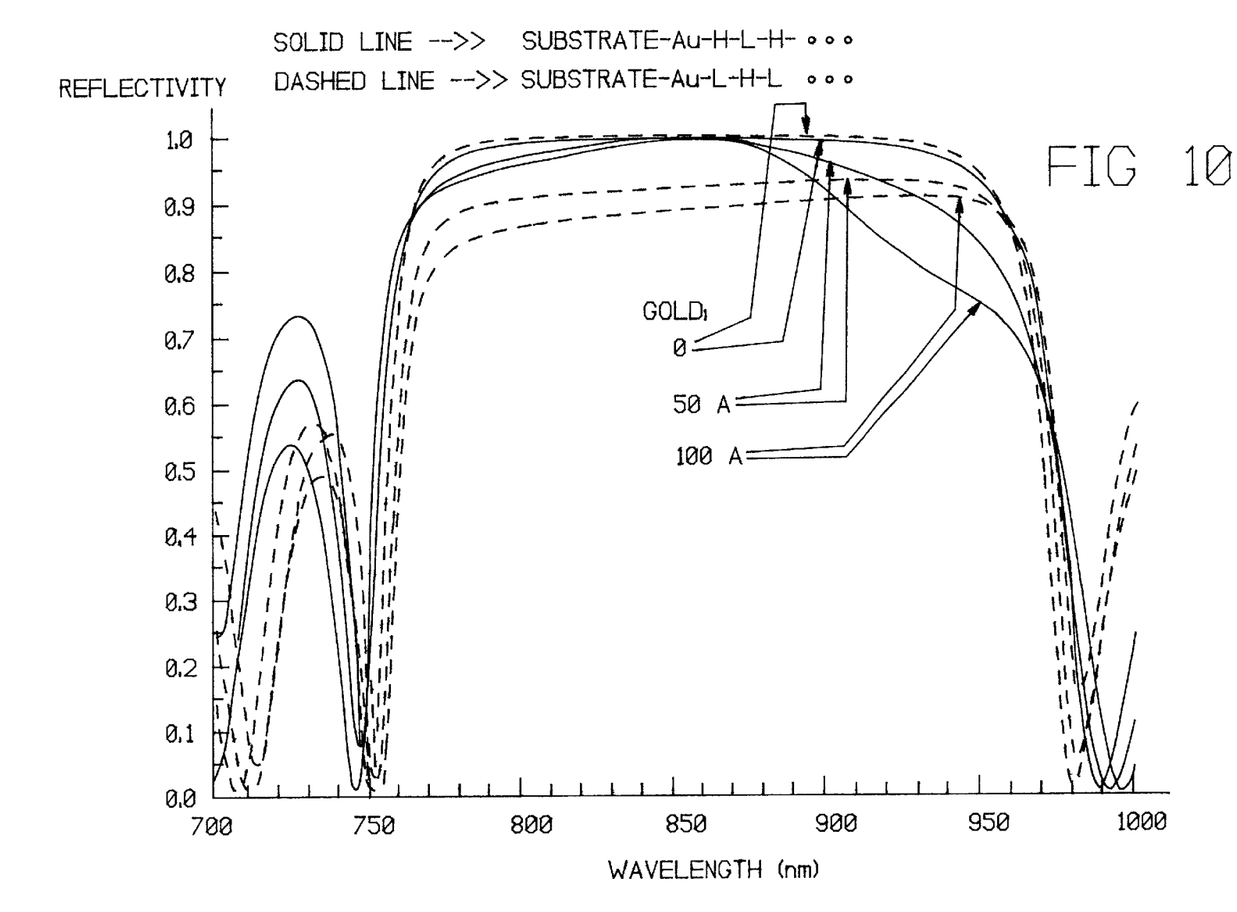
FIGS. 10, 11, 13, 14, 15, and 16 illustrate plots of various reflection coefficients computed for the structures of FIGS. 8 and 9.

FIG. 10 illustrates plots of the computations. The three plots in FIG. 10 drawn in solid lines correspond to FIG. 8, wherein the mirror-layer adjacent the gold layer 155 is of low index of refraction. That layer is the silicon dioxide layer within PAIR 1 in FIG. 8, having an index N of 1.45, as indicated.

The three plots in FIG. 10 drawn in dashed lines correspond to FIG. 9, wherein the layer 160 adjacent the gold layer 155 is of high index of refraction. As stated above, layer 160 is not present in FIG. 8. That layer 160 is titanium dioxide, wherein N equals 2.0.

Figure 11:
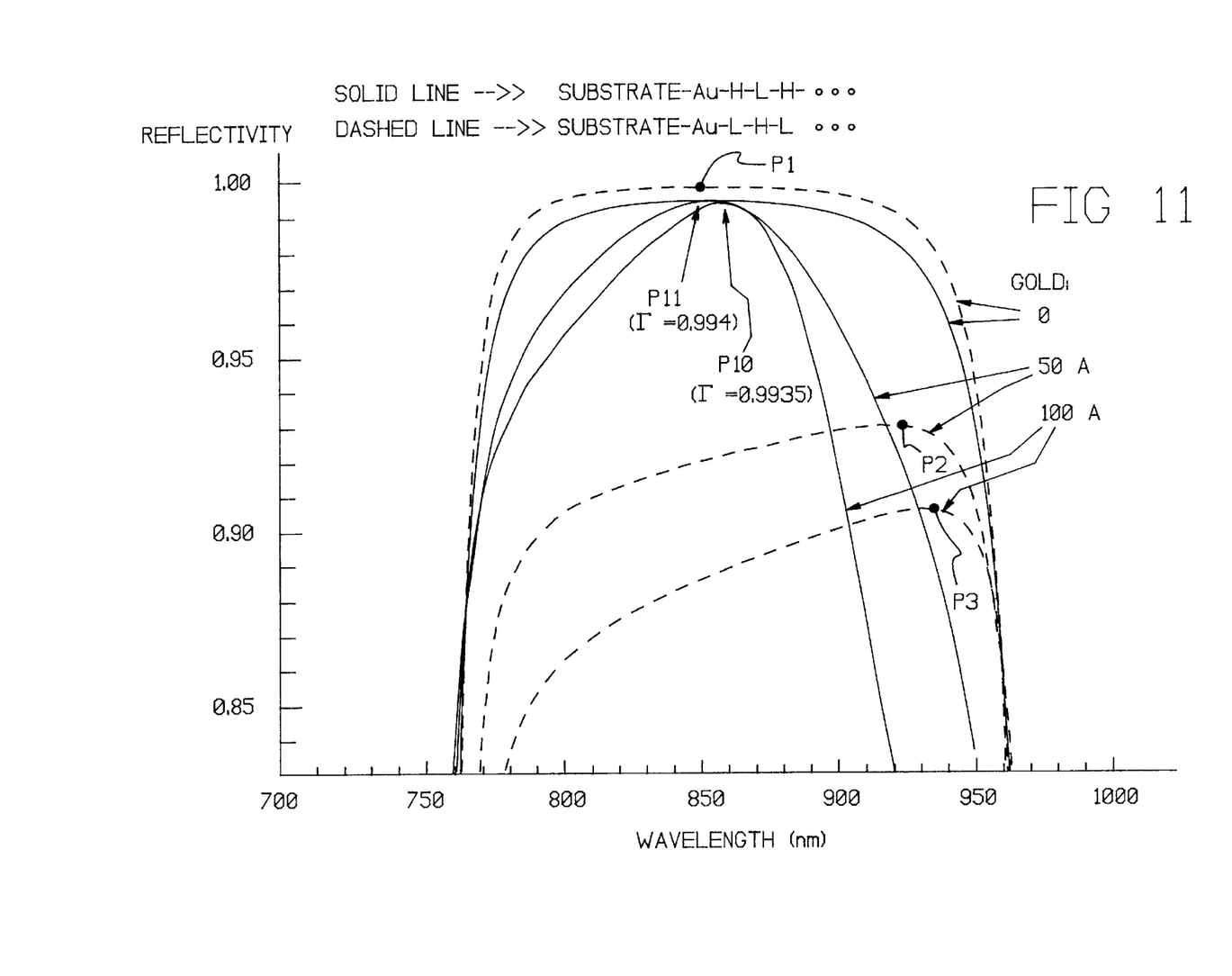

FIG. 11 is a magnified view of part of FIG. 10. A peak P1 for FIG. 8 occurs in the dotted line corresponding to zero gold thickness. This peak represents the conventional wisdom that, at 850 nanometers, in the structure of FIG. 8, with no gold layer 155 present, the reflection coefficient attains a maximum at a wavelength of about 850 nanometers. The actual numerical value of the maximal reflection coefficient, at P1, is 0.998. (Numerical computations are not indicated.)

Point P2 is also consistent with conventional wisdom: when a gold layer of 50 angstroms is added to FIG. 8, the peak reflection coefficient, near point P2, falls below 0.99. The reflection coefficient falls further for a thicker gold layer of 100 angstroms in FIG. 8 (point P3).

Therefore, points P1, P2, and P3 indicate that, as progressively thicker layers of gold are added in the form of layer 155 in FIG. 8, starting with zero thickness for point P1, the reflection coefficient progressively drops in value.

However, a reflection coefficient exceeding 0.99, that is, above 99 percent, is considered necessary in the top mirror 103 in FIG. 6 in order to attain a successful laser. Thus, points P2 and P3 represent reflection coefficients which are considered non-usable. Point P1 is non-usable because no layer of gold is present, and such a layer is required for another purpose in the invention, which is described below.

In pursuit of a sufficiently high reflection coefficient, the Inventors have discovered that, if the structure of FIG. 8 is modified in certain ways, then the reflection coefficient can be driven above the required minimum of 0.99. Modifications are shown in FIG. 9, and include (1) addition of the gold layer 155 of a specific thickness, (2) addition of the high-index layer 160, adjacent the gold, and (3) insertion of elements (1) and (2) in the positions indicated.

Restated, the Inventors begin with an ordinary mirror as in FIG. 8, with no gold layer 155 present. Then, as in FIG. 9, a high-index layer 160, of one-quarter wave thickness, is added to the bottom of the mirror containing 10 layer-pairs, namely, PAIR 1–PAIR 10. Also, a layer of gold 155, of proper thickness, is added adjacent the high-index layer 160.

Under these conditions, if the layer of gold 155 is 100 angstroms thick, the reflection coefficient is found to lie near point P10 in FIG. 11. (The reader is reminded that the solid plots in FIG. 11 correspond to FIG. 9.) When computed numerically, the reflection coefficient in this case is 0.9935. With a gold layer of zero thickness, the reflection coefficient is slightly higher, at 0.994, near point P11 in FIG. 11.

Thus, the Inventors have discovered that the layer 155 of gold in FIG. 9 has an almost negligible effect on the reflection coefficient, if it is paired with the dielectric layer 160. On the other hand, if dielectric layer 160 is absent, and a gold layer is merely added to the structure of FIG. 8, then the situation is that of the points P2 and P3 in FIG. 11, wherein the gold layer renders the mirror unusable.

Therefore, one form of the invention employs the structure of FIG. 9 as the top mirror of FIG. 6. That structure includes (1) the ten pairs, PAIR 1–PAIR 10, (2) the high-index titanium dioxide layer 160, and (3) the gold layer 155, in that order.

As stated above, FIG. 6 is a simplified schematic: the four layers of FIG. 6 indicating the top mirror actually represent the 22 layers in FIG. 9, which contain (1) the ten pairs, (2) layer 160, and (3) the gold layer 155.

In FIG. 9, the gold layer 155 can be viewed as acting as part of the top mirror, or as acting as part of the gain region in FIG. 6. These alternate views will be addressed later.

As stated above, the gold layer 100 in FIG. 6 provides another function, namely, it acts as a conductor for carrying current 106 from metal contact 109 to the p-type region 112.

Figure 12:
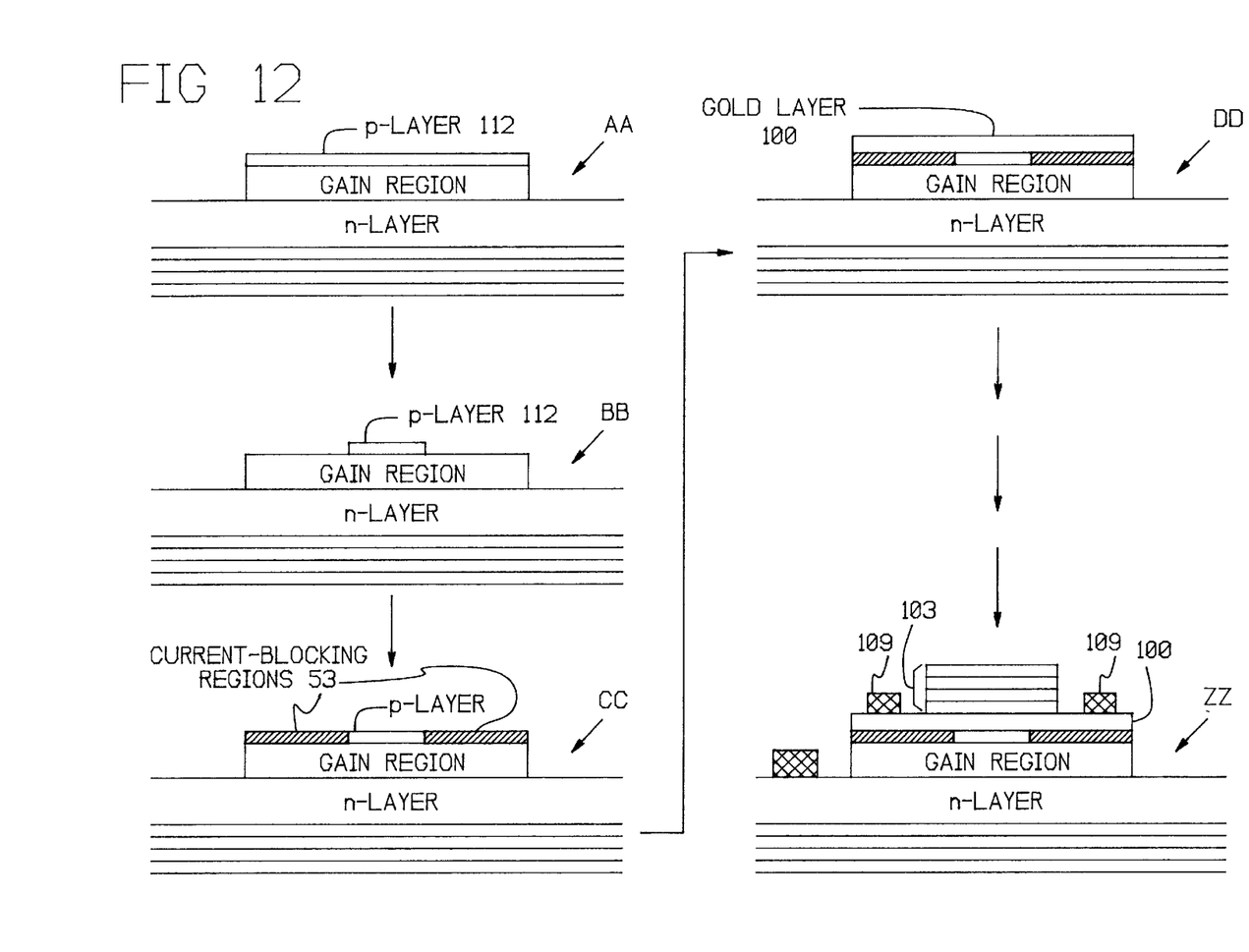
FIG. 12 illustrates a sequence of processing steps utilized by the invention.

Therefore, in one form of the invention, a simplified process for fabricating the current blocking region 53 in FIG. 6 has been provided. Structures AA, BB, and CC in FIG. 12 are fabricated, using known techniques. For example, the p-layer 112 in structure AA is fabricated, and then etched away, to produce the p-type mesa 112 in structure BB. Then, the surrounding current-blocking regions 53 are fabricated, in structure CC.

Next, the gold layer 100 in structure DD is deposited. Following that, known fabrication steps, indicated by arrows 120, produce structure ZZ.

Significantly, no crystal re-growth is undertaken, as occurs in reaching structure D of FIG. 5.

The gold layer 100 provides a current path for current 106 in FIG. 6. The gold layer also cooperates with the layers of FIG. 9, to provide a sufficiently high reflection coefficient to support stimulated emission.

Several refinements and additional embodiments will be discussed.

If the gold layer 155 in FIG. 8 is given a thickness of zero (that is, gold layer 155 is absent), then FIG. 8 illustrates a prior-art structure. The reflection coefficient at interface 150 is indicated by point P1 in FIG. 11.

The invention shifts that point P1 to a point near point P10 in FIG. 11, by utilizing the structure of FIG. 9, wherein the gold thickness is either 50 or 100 angstroms. However, P10 in FIG. 11 is located at a wavelength which is different from 850 nanometers. The maximum reflectance, near P10, now occurs at a longer wavelength: P10 lies to the right of point P1 in FIG. 11. The maximum reflectance point has been shifted toward the red end of the optical spectrum.

Figure 13:
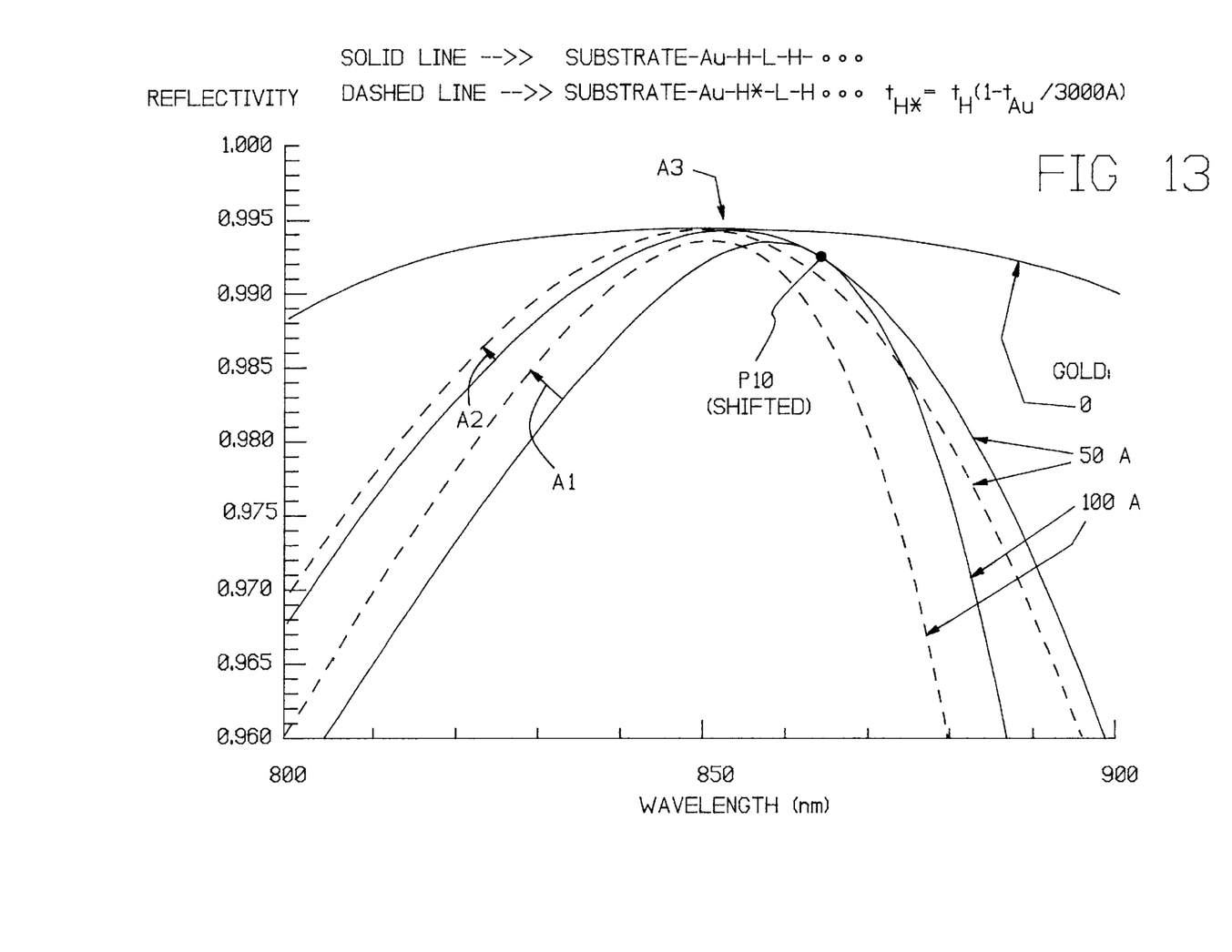

The Inventors have developed a stratagem for correcting this red-shift. FIG. 13 shows the results of the stratagem. The solid lines in FIG. 13 are magnified versions of parts of the corresponding lines of FIG. 11. The dashed lines in FIG. 13 indicate how the solid lines in that Figure are shifted when the stratagem is implemented. Arrows A1 and A2 indicate the shifting.

The stratagem is to adjust the thickness of layer 160 in FIG. 9 by a correction factor. The correction factor is the quantity $(1-t_{Au}/3000\ A)$, wherein $T_{Au}$ is the thickness in Angstroms of the gold layer 155. The correction factor is applied to layer 160, to adjust its thickness.

Specifically, in computing the correction factor, one divides the thickness, in Angstroms, of the gold layer 155 by 3,000, to obtain a quotient. Then one subtracts that quotient from unity. The result is a correction factor which is multiplied by the thickness of the quarter-wave layer 160. The result is the actual thickness of layer 160 which is to be used. That layer 160 in FIG. 9 is deposited upon the gold layer 155.

As a numerical example, for a thickness of gold of 100 angstroms, the correction factor is $(1-100/3,000)$, or 0.9667. One then multiplies a one-quarter-wave thickness of layer 160 in FIG. 9 by the correction factor, to obtain the actual thickness of layer 160 which is to be used. If the one-quarter-wave thickness is T, then the actual thickness used is 0.9667×T.

Of course, the one-quarter-wave original thickness of layer 160 is determined by the wavelength of light within layer 160, not in air or vacuum. The wavelength of light in a medium equals the free-space wavelength divided by the index of refraction of that material.

Implementing the correction factor shifts the solid plots in FIG. 13 to the dashed positions, as indicated by arrows A1 and A2. The peak reflectivity is now closer to 850 nanometers, or coincident with 850 nanometers, as indicated by arrow A3.

The Inventors point out that the thickness of the gold layer 155, namely, 100 Angstroms, is a small fraction of the thickness of the quarter-wave layers. For example, FIG. 13 indicates a wavelength of 850 nanometers, which corresponds to $850\times10^{-9}$ meter. One hundred Angstroms corresponds to $100\times10^{-10}$ meter. Thus, the thickness of the gold layer 155 corresponds to 10/850 of one wavelength, or roughly one percent (ie, 1/85) of a wavelength. Similarly, the thickness of the gold layer 155 is roughly 3 percent (ie, 4/85) of a quarter wavelength.

Omit Omit

For present purposes, this 3 percent thickness will be ignored.

High-index layer 160 in FIG. 9 can be viewed as an extension of the resonant cavity, which is the region between the top mirror 103 in FIG. 6 and the bottom mirror 175. It can be viewed as an extension of the resonant cavity because, traditionally, the cavity is viewed as terminating with a high-index material, and the mirror is viewed as beginning with a low-index material, namely layer LL in FIG. 6, which corresponds to the silicon dioxide layer in PAIR 1 in FIG. 9.

Consequently, since high-index layer 160 is a nominal quarter-wavelength in thickness, and is added to the thickness of the resonant cavity, which is an even number of quarter wavelengths, the cavity has now become an odd number of wavelengths in length. This fact leads to two modifications to the invention will be explained, against the background of a computation for the prior-art structure of FIG. 2.

Figure 14:
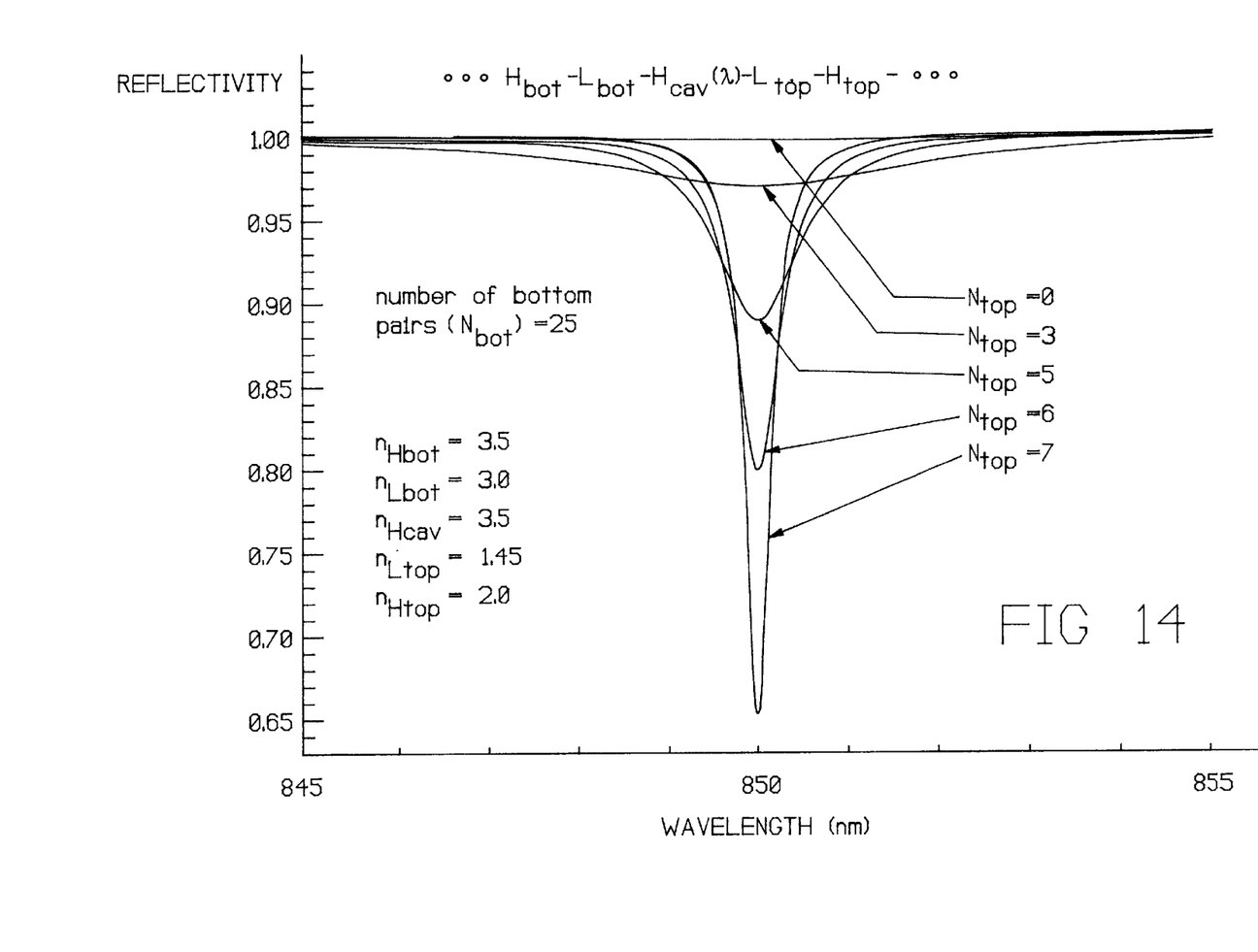

FIG. 14 illustrates the reflection coefficient of the entire prior-art structure: top mirror 33, bottom mirror 34, and the resonant cavity between them. In FIG. 14, as the number of top pairs, $N_{TOP}$ increases from zero to 7, the reflection coefficient drops. That is due to the fact that, as $N_{TOP}$ increases, the top mirror 33 becomes a better reflector. As the reflectance becomes progressively better, a Fabry-Perot cavity is being generated, explaining the drop in reflectivity. When the reflectance of the top mirror equals that of the bottom mirror (the equality situation is not indicated), reflectance in FIG. 14 will equal zero: complete destructive interference will occur in the cavity.

Figure 15:
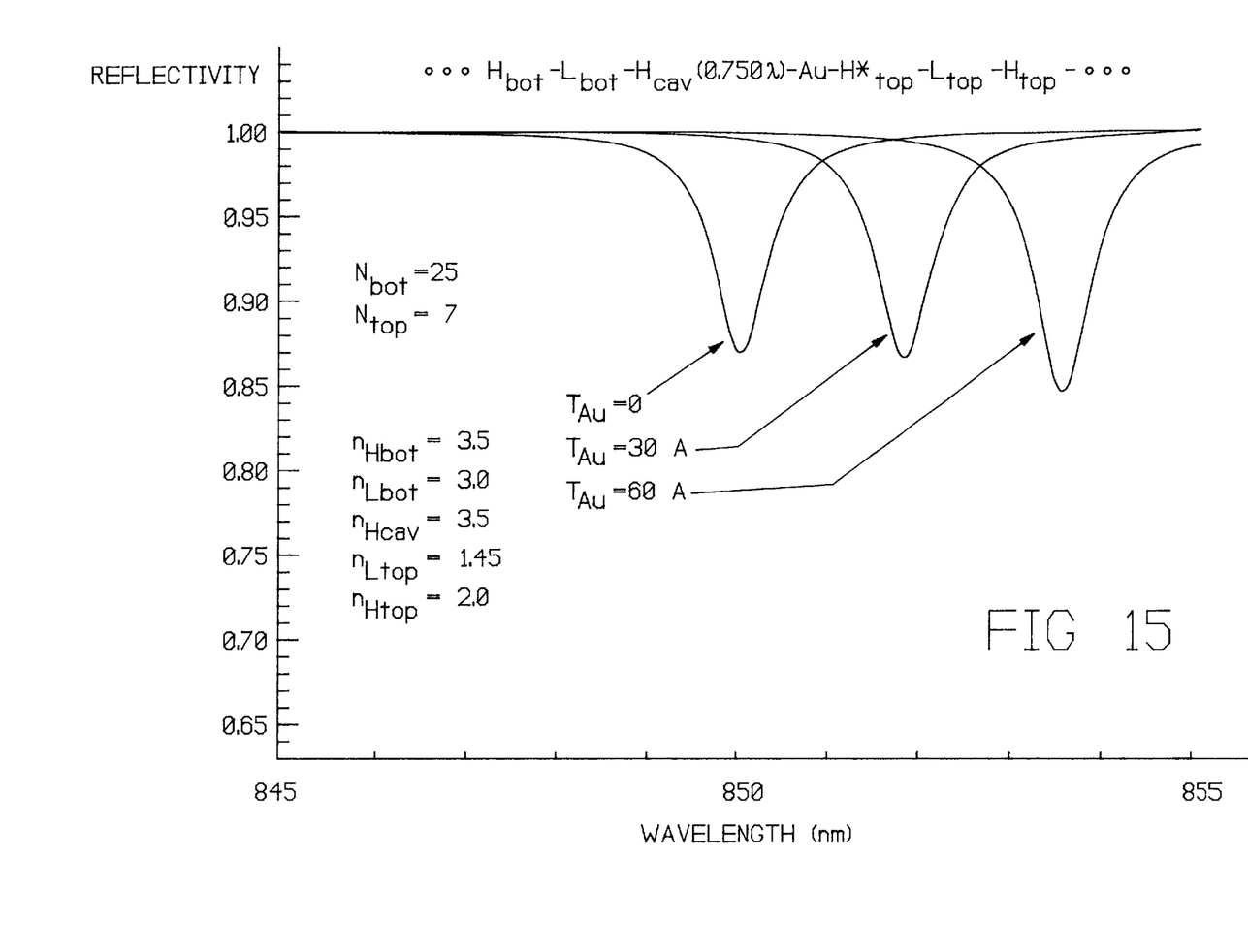

FIG. 15 illustrates the analogous reflectance for one form of the invention, namely, the structure of FIG. 6 using the mirror of FIG. 9. The length of the cavity has been changed: it is now is an odd multiple of quarter wavelengths, at 3 quarter-wavelengths in this example. That is, the distance between the top mirror 103 in FIG. 6 and the bottom mirror 175 is 3 quarter wavelengths. Top layer 160 in FIG. 9 provides an additional quarter-wavelength (nominal) to make the cavity an even number of quarter wavelengths, namely, four.

FIG. 15 indicates that, as the thickness of the gold layer increases, the wavelength at which minimal reflectance occurs increases. Another red shift has occurred.

Figure 16:
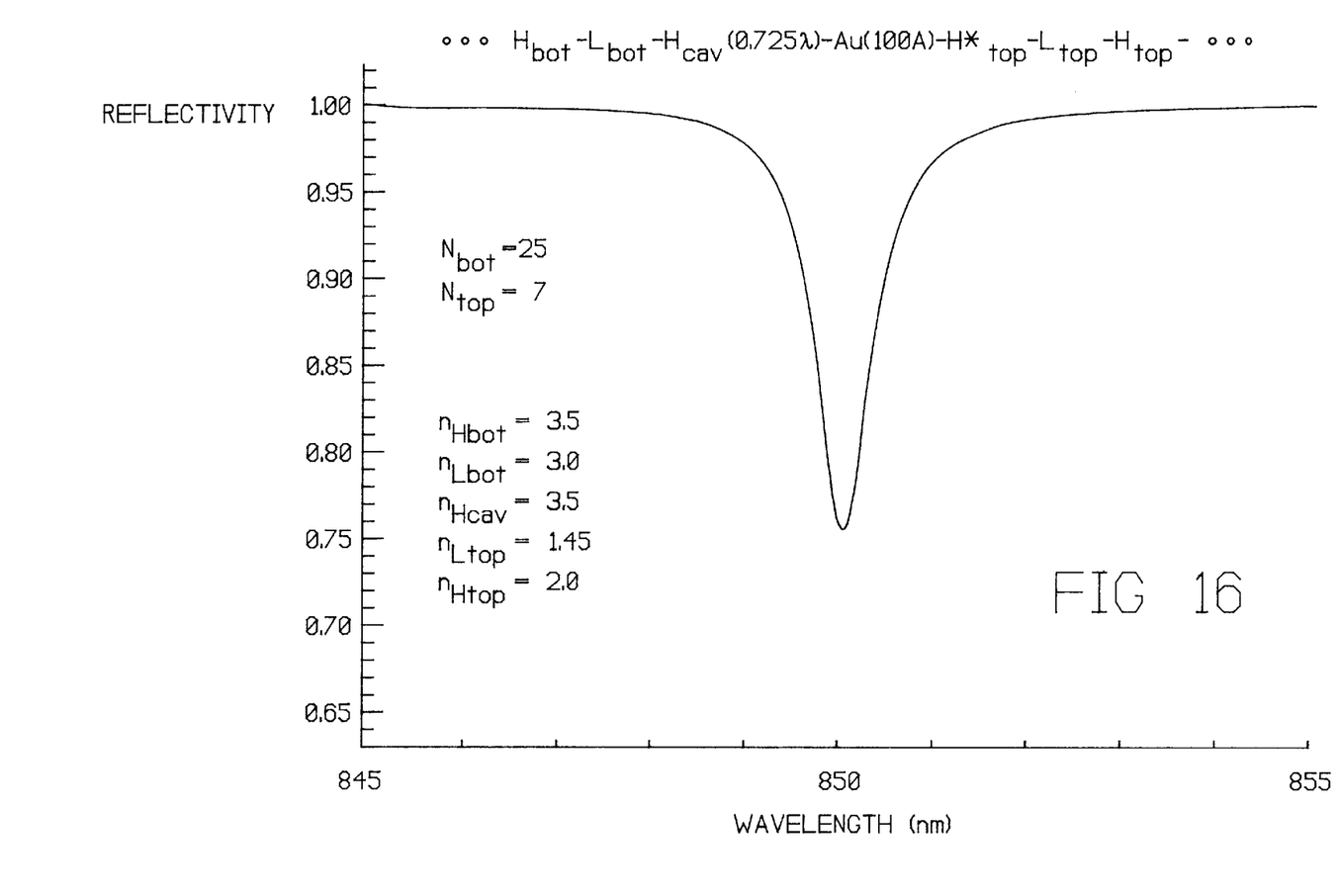

FIG. 16 illustrates a second stratagem for countering this red shift: the cavity (the distance between the top mirror 103 in FIG. 6 and the bottom mirror 175) is made 0.725 wavelengths in length, or slightly less than 0.75 wavelengths, which is 3 quarter-wavelengths. The gold layer 155 in FIG. 9 is 100 Angstroms thick. Layer 160 is the thickness computed according to the first stratagem, namely, 0.9667×(one quarter wavelength). The minimum, point P30 in FIG. 16, occurs at 850 nanometers.

The particular shapes and arrangements of the structures shown herein are dictated, in many cases, by the needs of the manufacturing processes used. At this point in the discussion, many of those structural aspects will be ignored, and some general principles will be discussed.

Figure 17:
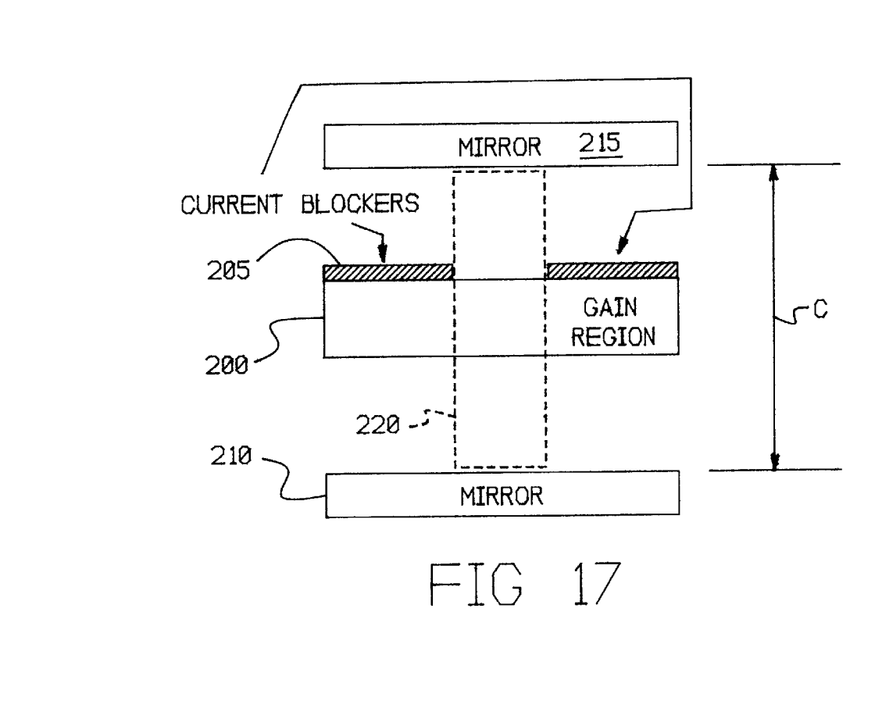
FIG. 17 is a simplified view of a VCSEL.

FIG. 17 illustrates a gain region 200, the current blockers 205, and mirrors 210 and 215. Many of the components in, for example, FIG. 5 function to (1) hold the components of FIG. 17 in position and (2) deliver current to the gain region 200. Those components have been eliminated from FIG. 17.

Figure 18:
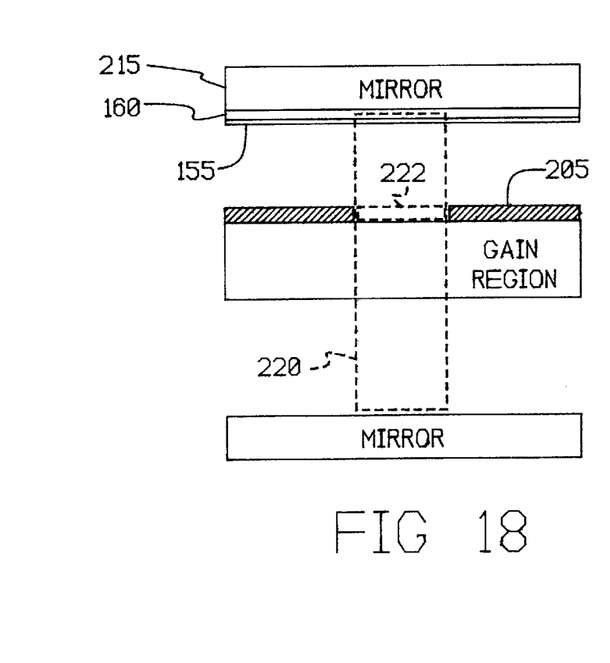
FIG. 18 is a simplified view of one form of the invention.

FIG. 18 illustrates one form of the invention. The components of FIG. 17 appear in FIG. 18, with the addition of gold film 155 and dielectric layer 160. The triplet of the top mirror 215, dielectric layer 160, and the gold layer 155 are preferably positioned so that gold layer 155 lies against current blockers 53.

The current blockers 53 may be viewed as limiting the optical pathways taken by the photons reflected between the mirrors. Those pathways are limited to dashed box 220. That is, the current blockers 53 surround part of the resonant cavity represented by dashed box 220, and constrain the reflected light to travel through that region 222.

The gold layer 155 delivers current to the mesa (illustrated as mesa 112 in FIG. 12) which occupies region 222 in FIG. 18, and which lies in the paths within dashed box 220.

Alternate Embodiments

Figure 7:
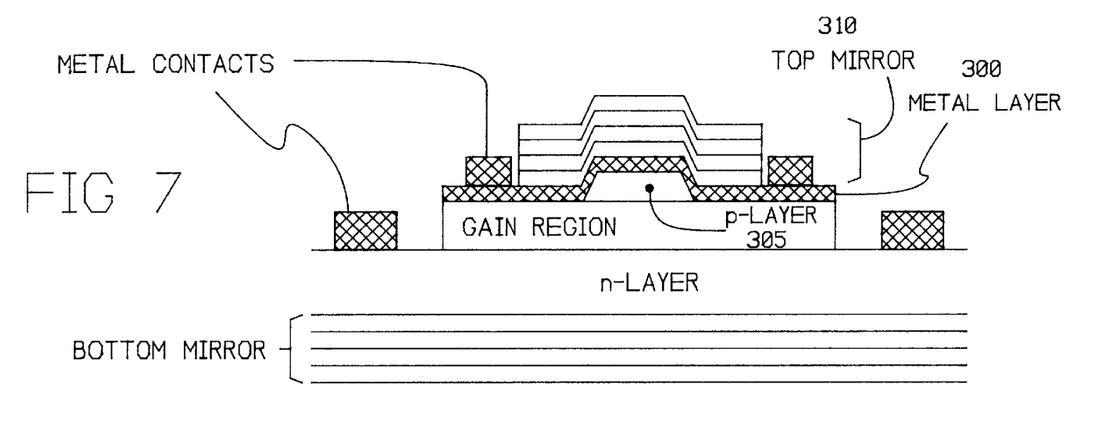

FIG. 7 illustrates an embodiment wherein the gold layer 300 is overlaid onto the p-layer mesa 305. The top mirror 310 and the extra dielectric layer corresponding to layer 160 in FIG. 9 (layer 160 not shown in FIG. 7) are deposited onto the gold layer 300. The layers composing top mirror 310 and layer 160 are conformal with the gold layer 300.

The preceding discussion has been framed in the context of a film 155 constructed primarily of gold. However, other materials can be used, such as gold alloys. Other metals can be used, such as silver, copper, or any of the good conductors. Superconductors can be used, which are not necessarily classified as metals. Doped semiconductors of sufficiently high conductivity should not be ruled out, although they may form a PN junction with mesa 112. The film 155 need not be of the single-crystal type.

Nomenclature

The term "quarter-wave dielectric layer" and similar terms are terms-of-art, and refer to a layer of dielectric material which is ¼ wavelength in thickness. The wavelength is measured within the layer, not in free space.

Numerous substitutions and modifications can be undertaken without departing from the true spirit and scope of the invention. What is desired to be secured by Letters Patent is the invention as defined in the following claims.

What is claimed is:

1. In a Vertical Cavity Surface Emitting Laser, VCSEL, which contains an optical cavity extending between first and second reflectors, the improvement comprising:
   a) current blocking means which
      i) surrounds an optical path running between the two reflectors, and
      ii) reduces edge-scattering at the first reflector; and
   b) a gold film
      i) through which light travels to reach the first reflector, and
      ii) which delivers current to a gain region in said optical path.

2. Improvement according to claim 1, wherein the gold film is 100 Angstroms thick.

3. Improvement according to claim 1, wherein the first reflector contains layers of high and low refractive indices, and further comprising a layer of dielectric material located between the gold film and the first reflector, and said layer is high refractive index.

4. A structure, comprising:
   a) a sequence of layers containing:
      i) a first layer, of n-type semiconductor;
      ii) a second layer, of p-type semiconductor;
      iii) a third layer, comprising
         A) a mesa of p-type semiconductor; and
         B) an insulator surrounding the mesa;
      iv) a layer of gold;
      v) a layer of dielectric, at least ten times thicker than the layer of gold; and
   b) two dielectric mirrors forming an optical cavity which contains the sequence of layers.

5. Structure according to claim 4, wherein the layer of gold supplies current which contributes to a population inversion at a junction between the first and second layers.

6. In a VCSEL for producing laser light of wavelength L, a structure comprising:
   a) a mirror comprising a stack of quarter-wave layers and in which the top layer and the bottom layer are both high index, H;
   b) a dielectric layer adjacent the bottom layer of the mirror and
      i) having a thickness of 0.9667×LD/4, wherein LD is the wavelength of the laser light within the dielectric layer, and
      ii) having an index equal to H;
   c) a film of gold 100 Angstroms thick adjacent the dielectric layer;
   d) a mesa adjacent the film of gold;
   e) a current blocking region surrounding the mesa; and
   f) a gain region adjacent the mesa.

7. For a vertical cavity surface emitting laser, VCSEL, which includes a resonant cavity between two mirrors, the improvement comprising:
   a) current blockers which
      i) surround part of the resonant cavity and
      ii) reduce edge losses of one of the mirrors; and
   b) a layer of gold which
      i) delivers current to said part, and
      ii) through which light travels in travelling between the two mirrors.

8. Apparatus, comprising:
   a) a laser containing an optical cavity;
   b) a mirror adjacent the optical cavity comprising:
      i) a stack of pairs of quarter-wave dielectric layers, each pair containing
         A) a high index layer, H-layer, and
         B) a low index layer, L-layer, with each L-layer in one pair being adjacent an H-layer in the adjacent pair, thereby providing
         C) a terminal H-layer on one end of the stack, and
         D) a terminal L-layer on the other end of the stack;
   c) a non-paired H-layer adjacent the terminal L-layer, and
   d) a film of gold adjacent the non-paired H-layer.

9. A VCSEL, comprising:
   a) a first mirror, comprising quarter-wave dielectric layers;
   b) a second mirror,
      i) comprising quarter-wavelength dielectric layers, spaced from the first mirror by 0.725 wavelengths, thereby forming an optical cavity,
      ii) containing layers of high, H, index and low, L, index, and
      iii) having the layers arranged in the sequence H-L-H-L . . . H-L, wherein a terminal low-index layer is located closest to the optical cavity;
   c) a gain region within the optical cavity, wherein optical gain occurs;
   d) a structure adjacent the terminal low-index layer, comprising two components:
      i) a layer of dielectric adjacent the low-index layer, of higher index than the low-index layer, and of thickness TD, and
      ii) a film of gold adjacent the layer of dielectric, of thickness TG,
   wherein TD equals (a quarter-wave thickness of the layer of dielectric) multiplied by a correction factor of (1−TG/3000) wherein TG is measured in Angstroms.

* * * * *